(12) United States Patent
Bobde

(10) Patent No.: US 7,880,223 B2
(45) Date of Patent: Feb. 1, 2011

(54) LATCH-UP FREE VERTICAL TVS DIODE ARRAY STRUCTURE USING TRENCH ISOLATION

(75) Inventor: Madhur Bobde, San Jose, CA (US)

(73) Assignee: Alpha & Omega Semiconductor, Ltd. (BM)

( * ) Notice: Subject to any disclaimer, the term of this patent is extended or adjusted under 35 U.S.C. 154(b) by 128 days.

(21) Appl. No.: 11/606,602

(22) Filed: Nov. 30, 2006

(65) Prior Publication Data

US 2007/0073807 A1   Mar. 29, 2007

Related U.S. Application Data

(63) Continuation-in-part of application No. 11/056,345, filed on Feb. 11, 2005, and a continuation-in-part of application No. 11/600,696, filed on Nov. 16, 2006, now Pat. No. 7,781,826.

(51) Int. Cl.
   *H01L 29/66* (2006.01)
(52) U.S. Cl. .................. 257/328; 257/355; 257/372; 257/E27.033
(58) Field of Classification Search ........... 257/328, 257/355, 362, 372, 374, E27.033
   See application file for complete search history.

(56) References Cited

U.S. PATENT DOCUMENTS

| | | | |
|---|---|---|---|
| 6,046,470 A * | 4/2000 | Williams et al. | 257/328 |
| 6,265,743 B1 * | 7/2001 | Sakai et al. | 257/305 |
| 6,867,436 B1 | 3/2005 | Matteson et al. | |
| 2002/0113293 A1 | 8/2002 | Robb et al. | |
| 2003/0173636 A1 | 9/2003 | Barkhordarian | |
| 2005/0167742 A1 * | 8/2005 | Challa et al. | 257/328 |

* cited by examiner

*Primary Examiner*—Thao X Le
*Assistant Examiner*—Robert Huber
(74) *Attorney, Agent, or Firm*—Bo-In Lin

(57) ABSTRACT

A method for manufacturing a transient voltage suppressing (TVS) array substantially following a manufacturing process for manufacturing a vertical semiconductor power device. The method includes a step of opening a plurality of isolation trenches in an epitaxial layer of a first conductivity type in a semiconductor substrate followed by applying a body mask for doping a body region having a second conductivity type between two of the isolation trenches. The method further includes a step of applying an source mask for implanting a plurality of doped regions of the first conductivity type constituting a plurality of diodes wherein the isolation trenches isolating and preventing parasitic PNP or NPN transistor due to a latch-up between the doped regions of different conductivity types.

2 Claims, 6 Drawing Sheets

LATCH-UP FREE VERTICAL TVS DIODE ARRAY STRUCTURE USING TRENCH ISOLATION

This Patent Application is a Continuation in Part (CIP) Application of a co-pending application with a Ser. No. 11/056,345 filed by a common Inventor of this Application on Feb. 11, 2005. This Patent Application is also a Continuation in Part (CIP) Application of a co-pending Application with a Ser. No. 11/600,696 filed by a common Inventor of this Application on Nov. 16, 2006 now U.S. Pat. No. 7,781,826. The Disclosures made in these two Applications are hereby incorporated by reference.

BACKGROUND OF THE INVENTION

1. Field of the Invention

The invention relates generally to a circuit configuration and method of manufacturing a transient voltage suppressor (TVS). More particularly, this invention relates to an improved circuit configuration and method of manufacturing vertical TVS array implemented with trench isolation for resolving a technical difficulty of latch-up.

2. Description of the Relevant Art

The conventional technologies for designing and manufacturing a transient voltage suppressor (TVS) array is still confronted with a technical difficulty that the in a TVS array wherein multiple PN junctions diodes are manufactured in a semiconductor substrate by applying a standard COMS processing steps, there are inherent PNP and NPN parasitic transistors. In an ESD event or the occurrence of a transient voltage, with a larger voltage applied to this TVS array, the parasitic NPN or PNP transistors are turned on and latched up, thus causing a sudden and strong voltage snap back. The sudden and large snapback may cause the undesirable effects of system instability or even damages. Additionally, the latch-up of the parasitic NPN or PNP transistors in the TVS array may further lead to other unexpected or undesirable voltage-current transient conditions. The technical difficulties caused by the parasitic PNP or NPN latch-up in the TVS array cannot be easily resolved.

Specifically, the transient voltage suppressors (TVS) are commonly applied for protecting integrated circuits from damages due to the inadvertent occurrence of an over voltage imposed onto the integrated circuit. An integrated circuit is designed to operate over a normal range of voltages. However, in situations such as electrostatic discharge (ESD), electrical fast transients and lightning, an unexpected and an uncontrollable high voltage may accidentally strike onto the circuit. The TVS devices are required to serve the protection functions to circumvent the damages that are likely to occur to the integrated circuits when such over voltage conditions occur. As increasing number of devices are implemented with the integrated circuits that are vulnerable to over voltage damages, demands for TVS protection are also increased. Exemplary applications of TVS can be found in the USB power and data line protection, Digital video interface, high speed Ethernet, Notebook computers, monitors and flat panel displays.

FIGS. 1A and 1B show a circuit diagram and a current-voltage diagram respectively of a TVS device. An ideal TVS is to totally block the current, i.e., zero current, when the input voltage Vin is less than the breakdown voltage Vb for minimizing the leakage current. And, ideally, the TVS has close to zero resistance under the circumstance when the input voltage Vin is greater than the breakdown voltage Vb such that the transient voltage can be effectively clamped. A TVS can be implemented with the PN junction device that has a breakdown voltage to allow current conduction when a transient input voltage exceeds the breakdown voltage to achieve the transient voltage protection. However, the PN junction type of TVS has no minority carriers and has a poor clamping performance due to its high resistance as that shown in FIG. 1B. There are alternate TVS implementations with Bipolar NPN/PNP with an avalanche-triggered turning-on of the bipolar transistor. The base is flooded with minority carriers and the bipolar TVS can achieve better clamping voltage as the avalanche current is amplified with the bipolar gain.

With the advancement of electronic technologies, there are increasingly more devices and applications that require TVS diode array for ESD protection, particularly for protecting high bandwidth data buses. Referring to FIG. 2A for a circuit diagram of a four channel TVS and FIG. 2B for side cross sectional views of device implementation of the TVS array showing only the core of the array device. The TVS array as shown in FIGS. 2A and 2B includes a plurality of high-side and low-side steering diodes connect in series wherein the high-side steering diodes are connected to Vcc and the low-side steering diodes connected to ground potential. Furthermore, these high-side and low-side steering diodes are connected in parallel to a main Zener diode wherein the steering diodes are much smaller and having lower junction capacitance. Additionally, as shown in FIG. 2C, such implementation further generates another problem of latch-up due to the SCR action induced by parasitic PNP and NPN transistors. The main Zener diode breakdown triggers the NPN on which further turns on the SCR resulting latch-up. In high temperature, the high leakage current through the NP junction of the parasitic NPN may also turn on the SCR leading to latch-up even though the NPN is not turned on. To suppress latch-up due to the SCR action induced by parasitic PNP and NPN transistors, the actual device implementation on a semiconductor substrate requires a lateral extension on the substrate of a distance that may be up to 100 micrometers or more as shown in FIG. 2B and the suppression usually is not effective enough.

FIGS. 3A and 3B illustrate particular difficulty caused by latch-up through the parasitic PNP transistor in an Ethernet differential protection circuit. In this Ethernet protection circuit, both Vcc and ground pins are floating. However, a parasitic SCR structure is not sufficiently weak in the design that causes a sudden voltage snap back as shown in FIG. 3B. Such sudden and strong snap back may cause undesirable effects of system instability or even damages. The difficulties cannot be easily resolved because the parasitic PNP transistor is inherent in the standard CMOS process and the fact that both Vcc and ground pin floating deteriorates the effect of latch-up. Additional buried layers are required to suppress the gain of the parasitic PNP transistors that causes complicated device configurations and high manufacturing costs.

Therefore, a need still exists in the fields of circuit design and device manufactures for providing a new and improved circuit configuration and manufacturing method to resolve the above-discussed difficulties. Specifically, a need still exists to provide new and improved TVS circuits that can effectively and conveniently prevent the parasitic PNP/NPN transistor latch-up.

SUMMARY OF THE PRESENT INVENTION

It is therefore an aspect of the present invention to provide a new and improved device structure for a TVS array to implement latch-up isolation trenches to prevent the latch-up of the parasitic PNP-NPN transistors such that the above-discussed difficulties and limitations encountered by the conventional TVS array can be overcome.

Another aspect of the present invention to provide a TVS array that implemented with isolation trenches between diodes such that the lateral distance between adjacent diodes can be reduced without the concerns of latch-up.

Briefly in a preferred embodiment this invention discloses a TVS array that includes a plurality of diodes formed as dopant regions of different conductivity types for constituting PN junctions in a semiconductor substrate. The TVS array further includes an isolation trench between the dopant regions for isolating and preventing latch-up of a parasitic PNP or NPN transistor.

The present invention further discloses a method for manufacturing an electronic device with an integrated transient voltage-suppressing (TVS) array. The method includes a step of manufacturing the TVS array in a semiconductor substrate by doping a plurality of dopant regions of different conductivity types to form diodes between PN junctions between these dopant regions. The method further includes a step of forming an isolation trench between the dopant regions for isolating and preventing a latch-up of a parasitic PNP or NPN transistor between the dopant regions of different conductivity types.

These and other objects and advantages of the present invention will no doubt become obvious to those of ordinary skill in the art after having read the following detailed description of the preferred embodiment, which is illustrated in the various drawing figures.

DETAILED DESCRIPTION OF THE METHOD

Figure 1A:
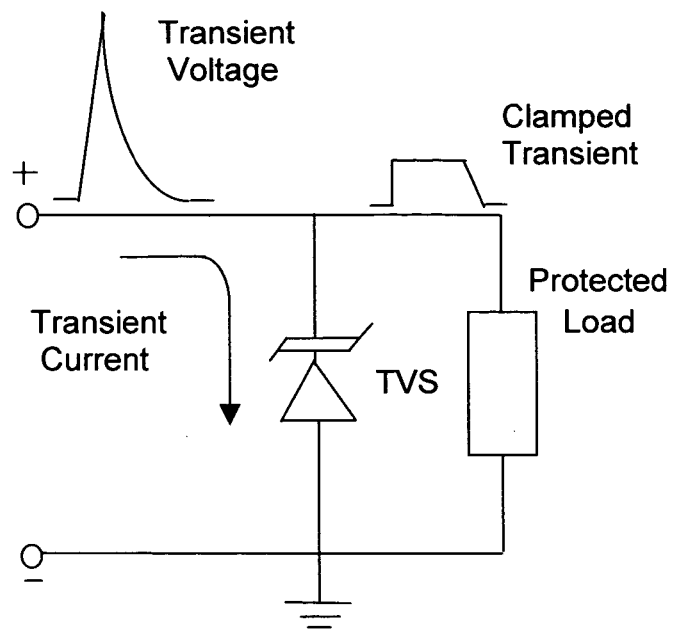
FIG. 1A is a circuit diagram for showing a conventional TVS device and FIG. 1B is an I-V diagram, i.e., a current versus voltage diagram, for illustrating the reverse characteristics of the TVS device.
Figure 1B:
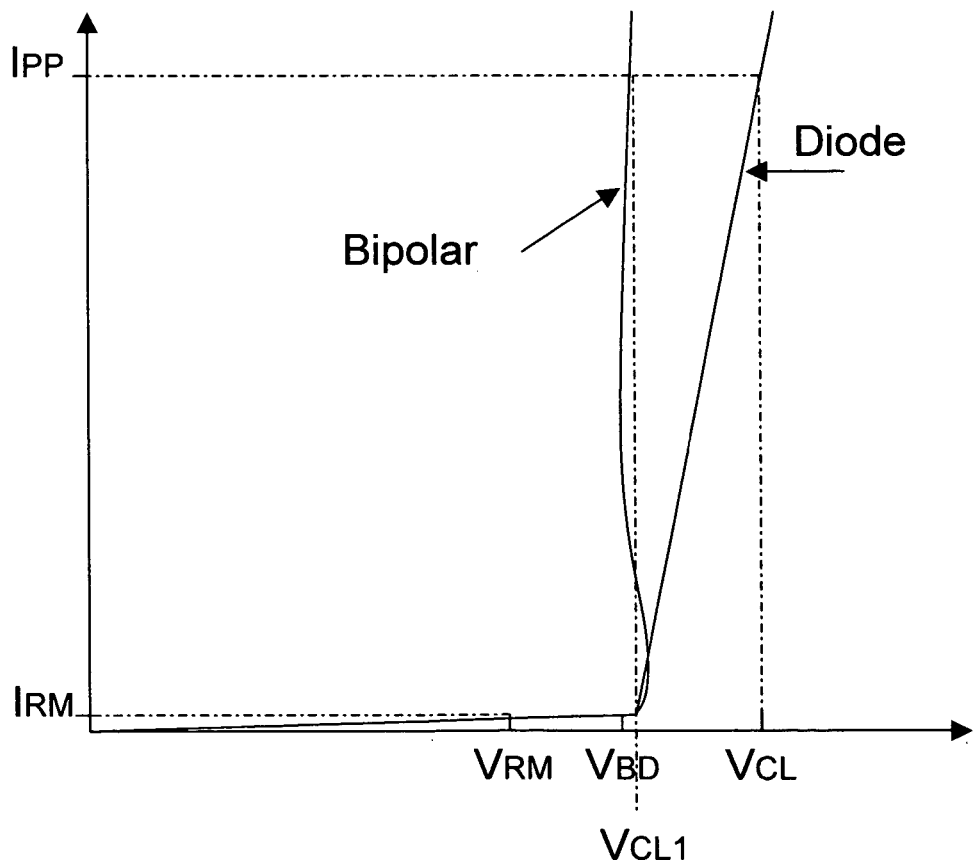
Figure 2A:
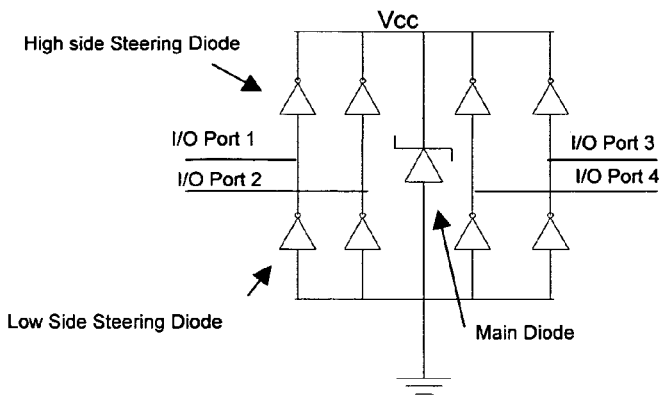
FIG. 2A shows a circuit diagram of a TVS array comprising a plurality of high side and low side diodes connected to a plurality of IO pads with a main Zener diode connected in parallel to the high side and low side diodes.
Figure 2B:
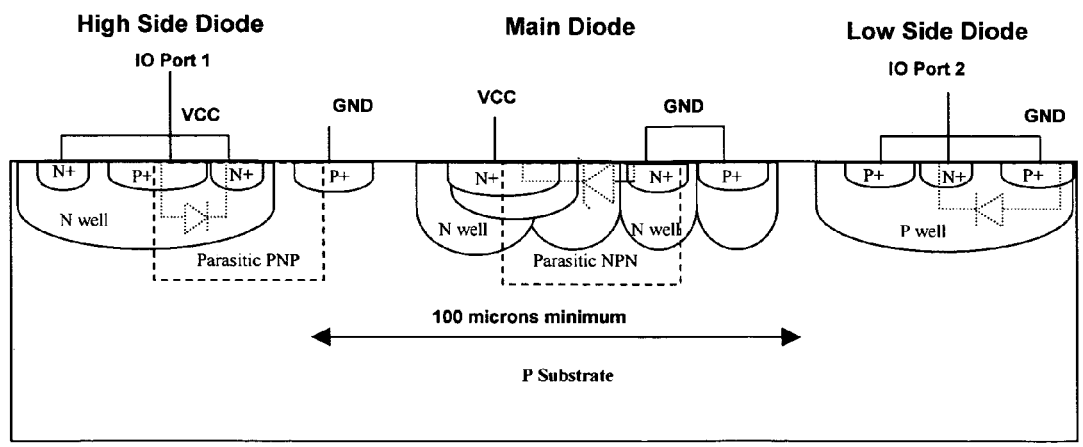
FIG. 2B is a side cross sectional view for illustrating device implementation of the TVS array of FIG. 2A according to a conventional device configuration.
Figure 2C:
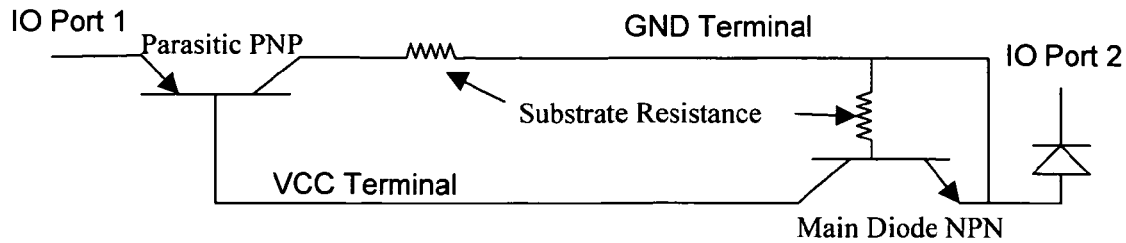
FIG. 2C shows the equivalent circuit diagram for illustrating the potential latch-up of device as implemented in FIG. 2B
Figure 3A:
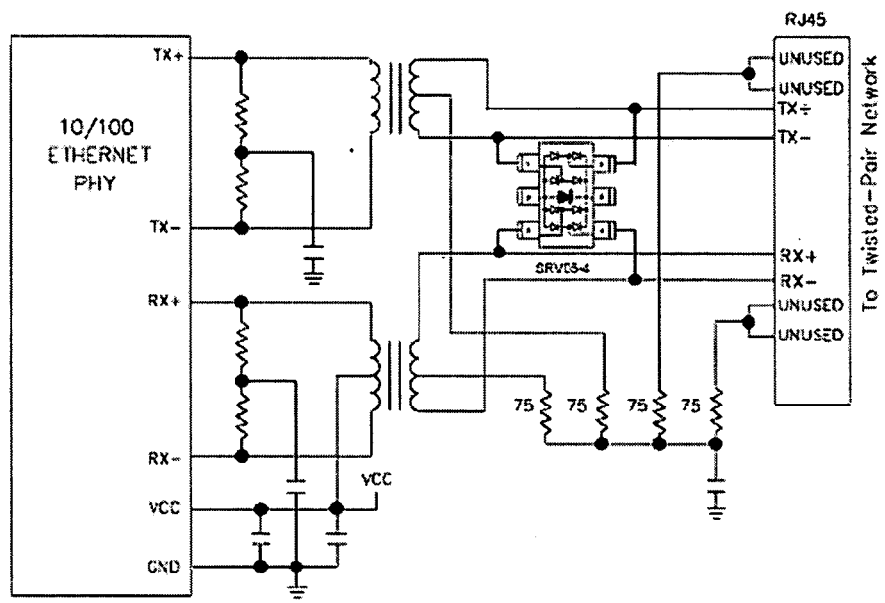
FIG. 3A is a circuit diagram of an Ethernet differential protection circuit that requires both Vcc and GND pins to float and requires buried layers to suppress gain of parasitic SCR with the protection circuit configured according to structures shown in FIG. 2B.
Figure 3B:
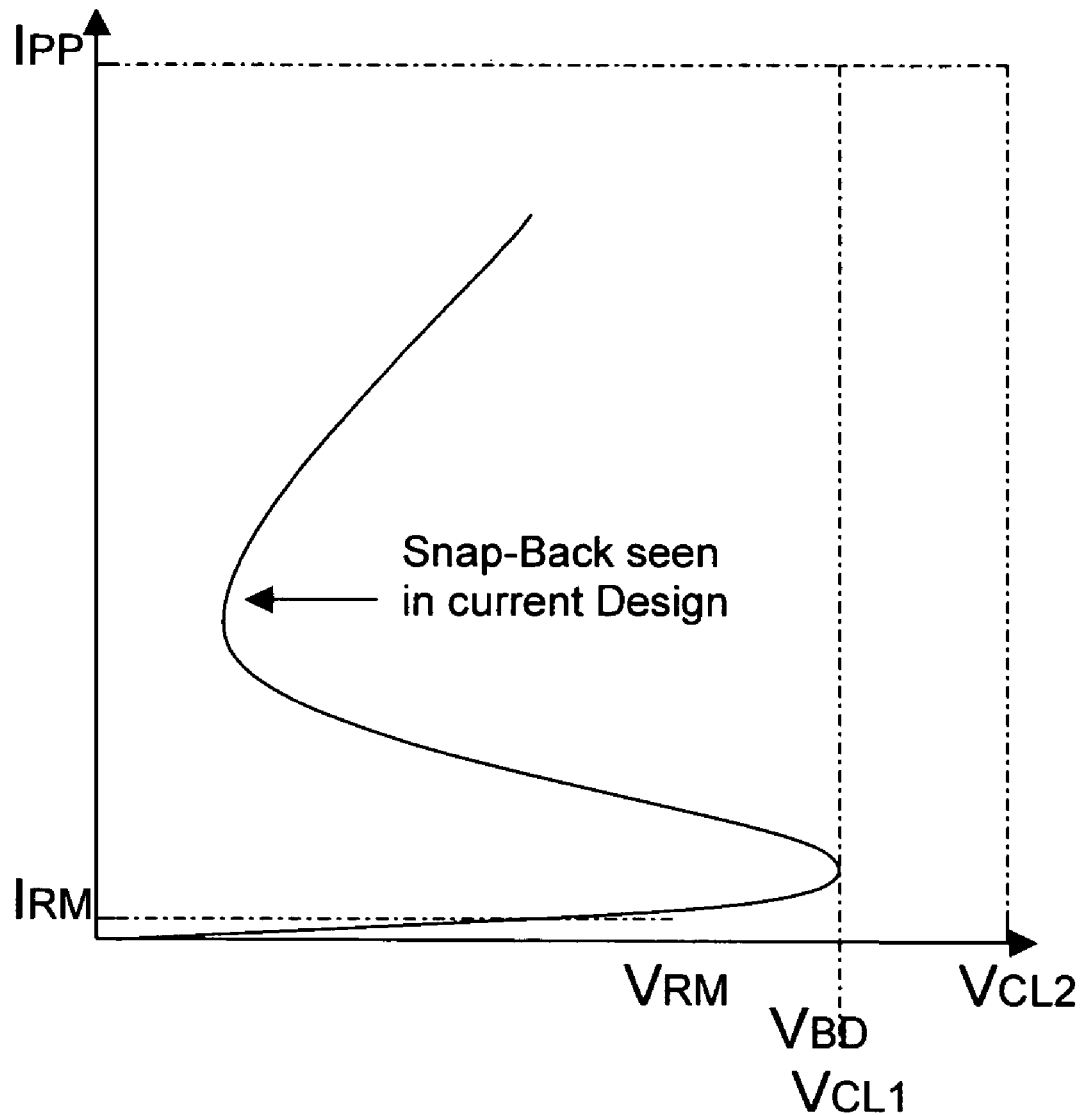
FIG. 3B shows an I-V diagram for illustrating an ESD protection or TVS operation when a conventional TVS array is applied that leads to the occurrence of an undesirable sudden and significant snap back.
Figure 4:
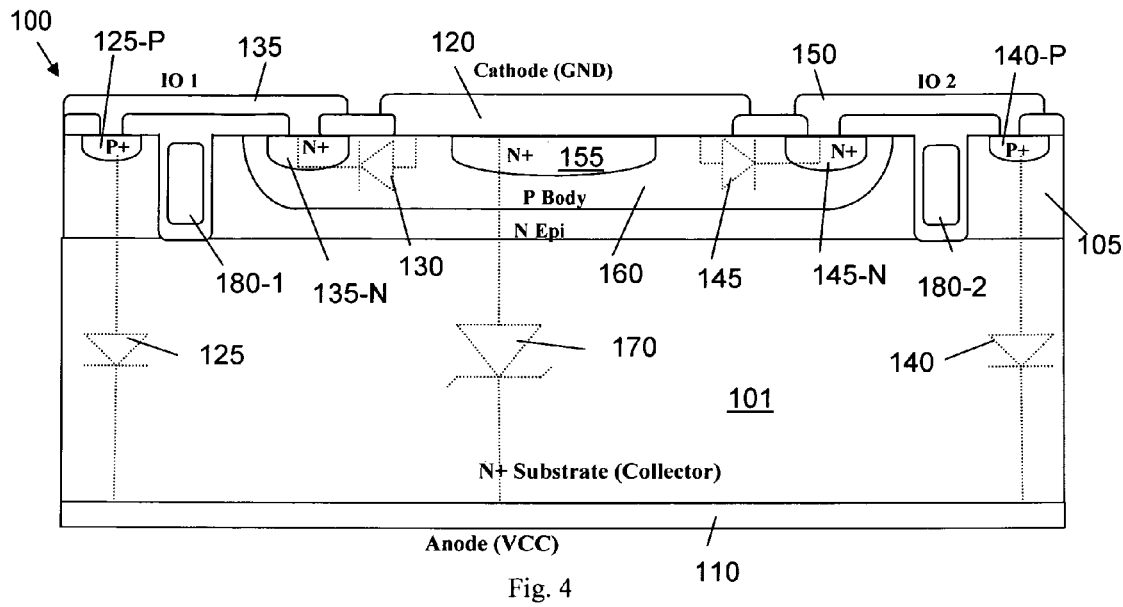
FIG. 4 is a side cross sectional view of a TVS array implemented with isolation trenches of this invention that significantly reduced the latch-up of the parasitic PNP or NPN transistors.

Referring to FIG. 4 for a side cross sectional view of a new and improved implementation a part of TVS array of this invention. The partial TVS array 100 as shown with two channels is supported on a N-epi layer 105 on top of a N+ substrate 101 with the bottom surface connected to an anode terminal 110 at a Vcc voltage. The TVS array is connected between the anode 110 disposed at the bottom surface and a cathode terminal 120 disposed at a top surface connected to a ground voltage. The TVS array 100 further includes a first high side diode 125 and a first low side diode 130 connected to a first IO terminal 135. The TVS array 100 further includes a second low side diode 140 and a second low side diode 145 connected to a second I0 terminal 150. The first high side diode 125 is formed as a PN junction between the P+ doped region 125-P and the N-epi 105. The first low side diode 130 is formed as a PN junction between an N+ region 135-N and a P-body region 160 disposed below the cathode terminal 120 with the first IO pad 135 connected to N+ dopant region 135-N of the first low side diode 130 and to the P+ dopant region 125-P of the first high side diode 125. The second low side diode 145 is formed as a PN junction between the N+ region 145-N and the P-body region 160 disposed below the cathode terminal 120 with the second IO pad 150 connected to N+ dopant region 145-N of the second low side diode 145 and to the P+ dopant region 140-P of the second high side diode 140. A Zener diode 170 of a greater area is formed with a PN junction between the P-body 160 and the N-epi. A NPN transistor that can be triggered on by Zener diode 170 is formed by N+ emitter region 155, P body region 160 and N+ substrate 101 to conduct large transient current without much resistance. The TVS array 100 further includes a first isolation trench 180-1 formed between the first high side diode 125 and first low side diode 130. The TVS array 100 further includes a second isolation trench 180-2 formed between the second high side diode 140 and first low side diode 145. The isolation trenches prevent the latch-up of the parasitic NPN or PNP transistors that are inherently formed between multiple PN junctions formed by the high side and low side diodes.

Figure 5:
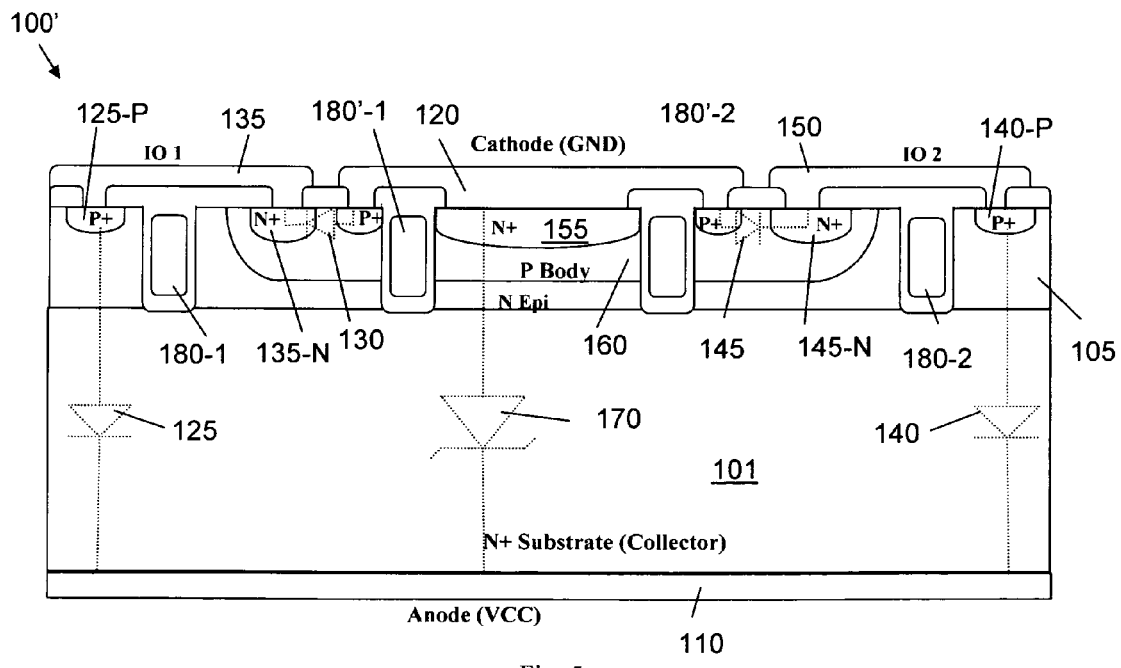
FIG. 5 is a side cross sectional view of another TVS array implemented with isolation trenches of this invention that significantly reduced the latch-up of the parasitic PNP or NPN transistors.

FIG. 5 is a side cross sectional view of new and improved implementation of another TVS array of this invention. The device 100' in FIG. 5 is similar to device 100 in FIG. 4 except that there are extra trenches in device 100' to provide better isolation. Trenches 180'-1 and 180'-2 separate the low side diodes from the main Zener diode region therefore break down the lateral NPN configured by N+ region 155, P body 160 and low side diode cathode regions 135-N and 145-N.

Figure 6:
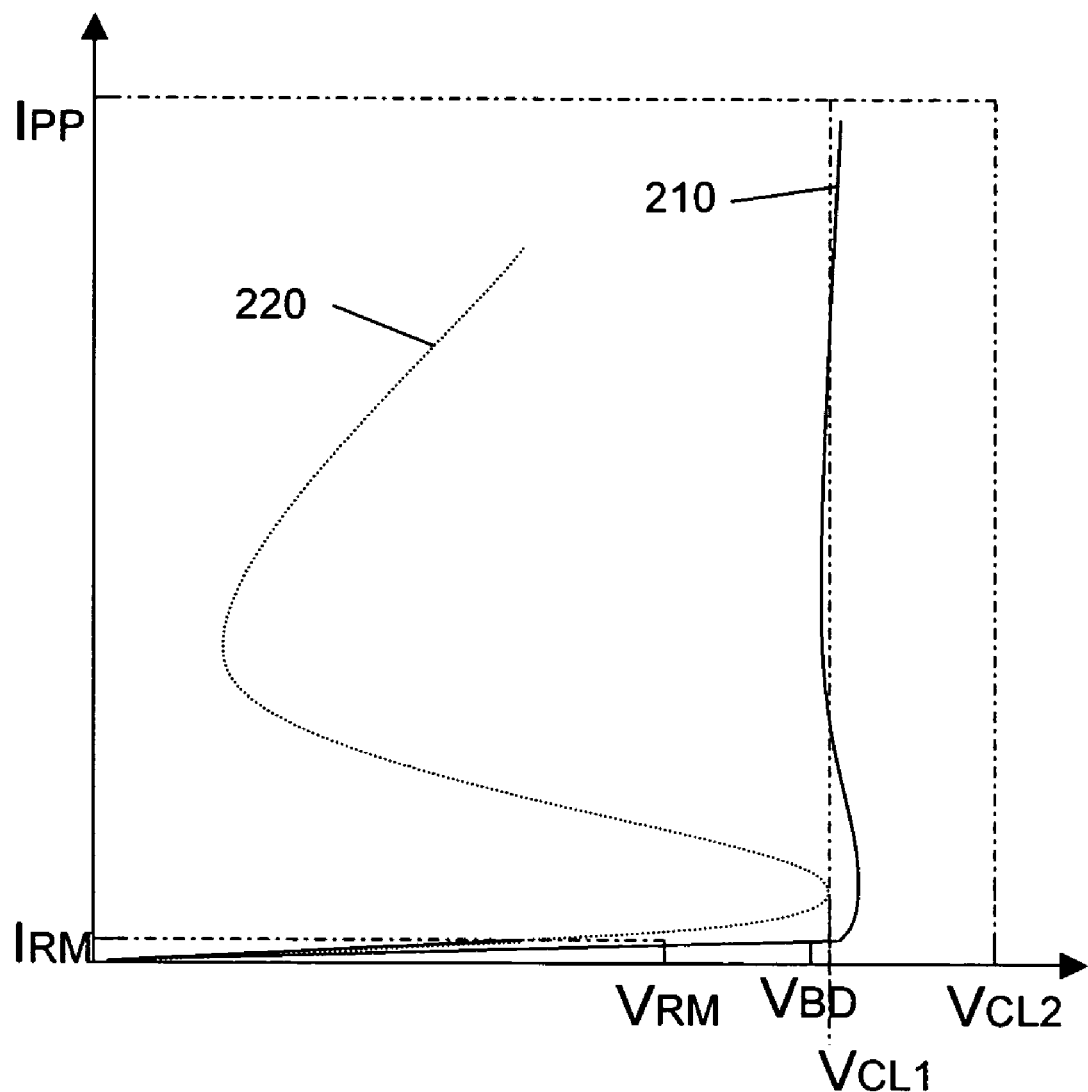
FIG. 6 is an I-V diagram for illustrating an operation of an ESD protection or TVS operation with significantly reduced snap back because the latch-up is eliminated.

FIG. 6 is an I-V diagram for illustrating an operation of an ESD protection or TVS operation with significantly reduced snap back because the latch-up is eliminated. As illustrated in the I-V diagram, the I-V curve 210 shows a sudden snap back due to the latch up of the parasitic NPN or PNP transistors that are likely to turn on with high voltage and current between different doped regions in the substrate in a TVS array. With the isolation trenches 180-1 and 180-2, the latch-up is eliminated and the snap back is greatly reduced. An I-V curve as shown in curve 210 is achieved with unduly causing system instability due to sudden voltage variations when a snap back occurs.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

I claim:

1. A transient voltage suppressing TVS array comprising:

a first high-side and a first-low side steering diodes of said TVS array formed as dopant regions of different conductivity types for constituting PN junctions in a semiconductor substrate;

an isolation trench disposed between said first high-side and said first-low side steering diodes disposed immediately on both sides of said isolation trench wherein said first high-side and said first low-side steering diodes are electrically connected in series to a common Input/output (I/O) terminal as a first I/O terminal pad; and wherein said isolation trench covered by an insulation layer underneath said first I/O terminal pad and filled with an insulation material therein for isolating and preventing a latch-up of parasitic PNP or NPN transistor between said doped regions in said semiconductor substrate of different conductivity types for suppressing a snap back of a voltage on said common I/O terminal for suppressing a transient voltage;

a main Zener diode comprising a body region of a second conductivity type disposed in an epitaxial layer of a first conductivity and said Zener diode is disposed between said first and second low-side steering diodes isolated from said first and second high-side steering diodes by two of said isolation trenches wherein said Zener diode is electrically connected to a cathode terminal as a separate electrical terminal from said first and second I/O terminal pads;

at least two additional PN junctions disposed immediately adjacent to and isolated by a second isolation trench connected in series to a second input/output (I/O) terminal pad functioning respectively as a second high-side steering diode and a second low-side steering diode wherein said second isolation trench is covered with an insulation layer underneath said second I/O terminal pad and filled with an insulation material therein;

said semiconductor substrate further comprising a N-type substrate supporting said epitaxial layer of a N-type conductivity wherein said semiconductor substrate with an anode electrode disposed on a bottom surface of said substrate for connecting to a high voltage and said cathode electrode disposed on a top surface for connecting said Zener diode to a low voltage; and a dopant region of a N-conductivity type in said P-body region for constituting a NPN transistor with said body region and said epitaxial layer wherein said dopant region of said N-conductivity type is disposed near a top surface of said semiconductor substrate for directly connecting to said cathode electrode and is triggered on by said main Zener diode to conduct a large transient current with a low resistance.

2. The TVS array of claim 1 wherein:

said first and second low-side steering diodes further comprising a first and second N-dopant regions formed in said body region on two opposite side of said Zener diode and said first and second high-side steering diodes further comprising a first and second P-dopant regions disposed in said N-type epitaxial layer wherein said first high side steering diode and said first low side steering diode are insulated by said first insulation trench and said second high side steering diode and said second low side steering diode are insulated by said second insulation trench in said semiconductor substrate and interconnected in series by said first and second I/O terminal pads respectively.

* * * * *